United States Patent [19]

Gonzalez et al.

[11] Patent Number: 4,857,833
[45] Date of Patent: Aug. 15, 1989

[54] DIAGNOSIS OF FAULTS ON CIRCUIT BOARD

[75] Inventors: Roberto Gonzalez, Franklin; Lawrence S. Apfelbaum, West Newton, both of Mass.

[73] Assignee: Teradyne, Inc., Boston, Mass.

[21] Appl. No.: 89,828

[22] Filed: Aug. 27, 1987

[51] Int. Cl.$^4$ .................. G01R 31/00; G01R 31/02
[52] U.S. Cl. ..................... 324/73 R; 324/73 AT; 324/73 PC; 364/482
[58] Field of Search ........... 324/73 AT, 73 R, 73 PC, 324/64; 364/482

[56] References Cited

U.S. PATENT DOCUMENTS

| | | | |
|---|---|---|---|
| 4,114,093 | 9/1978 | Long | 324/73 AJ |
| 4,176,313 | 11/1979 | Wrinn . | |
| 4,454,585 | 6/1984 | Ele | 324/73 PC |
| 4,459,693 | 7/1984 | Prang et al. . | |
| 4,565,966 | 1/1986 | Burr et al. | 324/73 PC |
| 4,638,246 | 1/1987 | Blank et al. | 324/73 R |
| 4,647,846 | 3/1987 | Malkin . | |
| 4,651,088 | 3/1987 | Sawana | 324/73 R |
| 4,680,761 | 7/1987 | Burkness | 324/73 R |
| 4,698,589 | 10/1987 | Blankenship et al. | 324/73 R |
| 4,711,024 | 12/1987 | Russell | 324/73 R |
| 4,714,875 | 12/1987 | Bailey et al. | 324/73 PC |

FOREIGN PATENT DOCUMENTS 2100448 12/1982 United Kingdom ........... 324/73 PC

OTHER PUBLICATIONS

"Optimization by Simulated Annealing", by Kirkpatrick et al., Science, 13 May 1983, vol., 220, #4598, pp. 671–680.
"Improving In-Circuit Diagnosis of Analog Networks With Expert Systems Techniques", by Apfelbaum, 1986 IEEE Internat. Test Conf., paper 25.3, pp. 947–953.
"An Expert System for In-Circuit Fault Diagnosis", by Apfelbaum, IEEE 1985 Internat. Test Conf., pp. 868–874.
"Bus Architectures-A Practical Solution to Component-Level Fault Diagnosis", by Busch, 1984 Proceedings of the ATE Central Conf., pp. II-10 through 15.

Primary Examiner—Reinhard J. Eisenzopf
Assistant Examiner—W. Burns

[57] ABSTRACT

A method of determining which of a plurality of electrical devices connected to a node of a circuit under test is causing a failure at that node by causing individual devices to drive the node one device at a time, taking passive voltage measurements at the node at separate times when individual devices are controlled to drive the node, and analyzing measured voltages resulting when different devices are driving the node to identify which is causing the failure.

76 Claims, 6 Drawing Sheets

DIAGNOSIS OF FAULTS ON CIRCUIT BOARD

FIELD OF THE INVENTION

The invention relates to automatic test equipment for determining which of a plurality of electrical devices connected to a node of a board under test is causing a failure at that node.

BACKGROUND OF THE INVENTION

When testing a circuit using an automatic test system, inputs are provided to the circuit under test, and the resulting outputs are detected and compared with expected outputs. In an in-circuit test, the system electronics has access to each lead of the individual components on a board under test through a bed-of-nails fixture, and the individual components are tested in turn. The goal of in-circuit testing is to electrically isolate each device from its surrounding circuitry so that it can be tested individually. In addition to providing inputs directly to the input pins of the particular component being tested, inputs are provided to other components that affect the condition at inputs of the particular component being tested.

When there are a plurality of devices connected to a node, e.g., a bus, a single faulty device could provide failure conditions on the node during testing of plural devices, and further analysis is required to identify which of the devices connected to the node is the faulty one. Examples of causes of faults on nodes are an output that is stuck at a high or low state, a tristate device enable that is malfunctioning, an input that is shorted internally, and a pull-up that is shorted or missing.

Determining which device is at fault can be complicated by the fact that different device technologies exhibit different output characteristics. Each device on a bus has an output stage that can drive the bus high, drive it low, or go into an off mode. Advanced Schottky (AS) devices, for example, have a low output impedance and can drive the bus with ample current. Complementary metal oxide semiconductor (CMOS) devices, by contrast, have little or no current drive capability. Each technology also has a clamping voltage for either the high or low driving state. Because of the range of driving capabilities for different technologies, it is difficult to distinguish the faulty device by measurement alone. Diagnosing bus node failures can also be further complicated by certain device failure modes. For example, combinational CMOS devices can become sequential, causing failures only at certain times.

Most existing in-circuit test systems use a current forcing/measurement technique and one or two simple rules to diagnose bus failures. For example, Busch, "Bus Architectures - A Practical Solution to Component-Level Fault Diagnostics", *IEEE* 1984 *Proceedings of the ATE Central Conference*, pp. II-10 through II-15 describes a system which attempts to find the bad device by measuring the amount of current in the node being supplied by the bad device. Each device is brought in turn to the failing stuck-at state, and the current is measured again. The premise is that the failing device will not contribute any additional current beyond that which it is providing while stuck and will be spotted in this way.

SUMMARY OF THE INVENTION

It has been discovered that the identity of which of a plurality of electrical devices connected to a node of a board under test is causing a failure could be advantageously determined by taking passive voltage measurements when individual devices drive the node and analyzing the measurements to identify which device is causing the failure. The use of passive measuring eliminates any risk of device destruction associated with driving current at the node. The measurement is quick and accurate and can therefore be used to make a measurement of dynamic faults which might otherwise have been missed by a slower measurement technique.

In preferred embodiments there are trigger, measurement, transformation and analysis phases.

The trigger phase provides for triggering of the passive voltage measurements when there has been a failed output at a device during testing and other conditions, generally indicating bus failure, have been met. The triggering includes listing the failed outputs of the device and information relating to the failed pin for use in measuring. By triggering these special measurements only when a node fails, test time overhead is minimized.

In the measurement phase the passive measurement is made by injecting a small current into the node and measuring the resulting change in voltage; prior to making the measurement, test vectors prior to a clock period during which there was a failure are provided to the device, and the inputs affecting the device are held at a predetermined state during the measurement, to stabilize the signal being measured; the passive measurements include taking a plurality of voltage measurements at a node at different injected currents while the pin is driven at each of a plurality of output states; the current is reduced if a prior measurement involved a current that resulted in saturating the device; the range of the voltage measuring instrument is adjusted if a prior measurement produced a measured voltage outside of its range; the injected currents are incremented in value between successive measurements, the magnitude of the incrementing being dependent upon the technology type of the device; the measurements are made on a new node after a predetermined number of successful measurements have been made at a node. In this manner the most useful information about a node is obtained in as few measurements as possible.

The transformation phase involves transforming the voltage measurements to a standard scale so that measurements for different devices on the node (which devices could have different technologies and different output characteristics) can be compared. The transforming includes: computing a Thevenin equivalent impedance and voltage; computing a Thevenin equivalent impedance for a hypothetical stuck device at the node; taking the difference of measured voltage when a device is driving in a high state and when it is driving in a low state; and integrating the difference between the off state and the opposite state of the stuck state.

The analysis phase involves applying rules to the transformed data to identify faulty devices. After a rough diagnosis to identify potential candidates for the faulty device, further rules are used to chose between plural devices that have been identified as candidates. The analyzing includes: identifying as faulty the device having the highest impedance; identifying as faulty the device having the lowest hypothetical stuck device impedance; identifying as faulty the device having the lowest difference in voltages at high and low states; identifying as faulty the device having the smallest integrated value; and using further rules to choose between plural devices identified as faulty by the above rules.

Other advantages and features of the invention will be apparent from the following description of the preferred embodiment thereof and from the claims.

DESCRIPTION OF THE PREFERRED EMBODIMENT

The preferred embodiment will now be described.

Drawings

STRUCTURE

Figure 1:
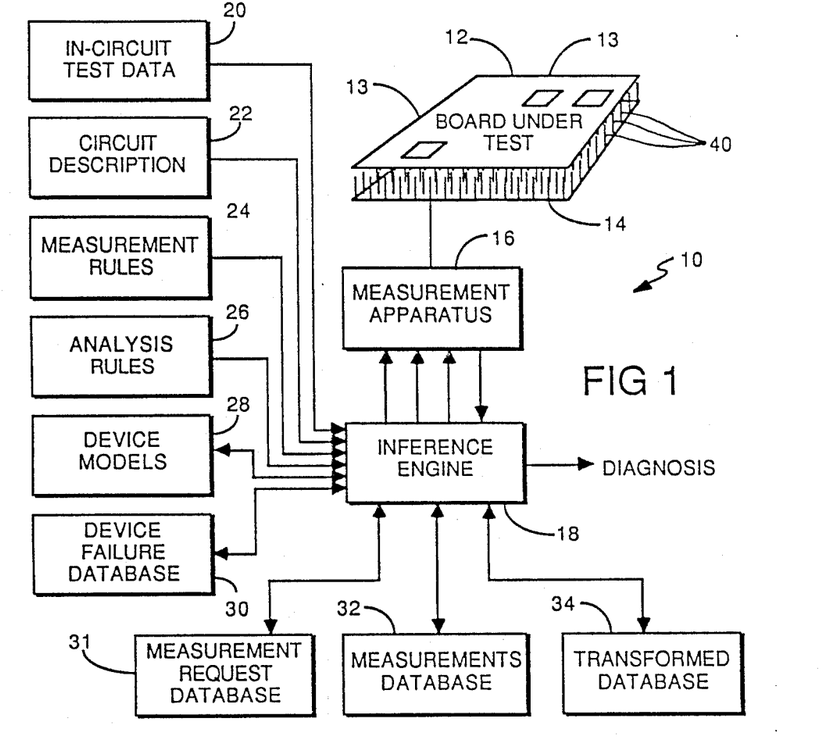
FIG. 1 is a diagram of a system for diagnosing bus faults during in-circuit testing of a board under test according to the invention.

Referring to FIG. 1, there is shown bus failure diagnosis system 10, which is incorporated in an in-circuit test system that is testing board-under-test (BUT) 12 includes a plurality of devices 13 thereon. System 10 includes bed of nails 14 for making electrical contact to nodes of BUT 12 and associated measurement apparatus 16, which provides inputs to BUT 12, detects outputs from it and also makes passive voltage measurements according to the invention to diagnosis bus failures. Measurement apparatus 16 is operated under expert system (i.e., artificial intelligence) software control by inference engine process 18, which refers to static data bases 20, 22, rules 24, 26 and dynamic data bases 28, 30, 31, 32, 34. The output of inference engine 18 is a diagnosis indicating the devices on BUT 12 that have caused bus failures. The software is centered around the BLISS compiler, discussed in W. Wulf, et al., "The Design of an Optimizing Compiler", *American Elsevier*, New York, NY (1975); the associated syntax allows programming at a relatively high level, and the compiler allows including predefined libraries of constants, definitions, and macros. The production rules language is modeled somewhat after OPS5, described in C. L. Forgy, "OPS5 User's Manual," Department of Computer Science, Carnegie-Mellon University, 1981, but consists of macros for BLISS instead of an interpreted language devoted to rule based systems. The bus diagnosis expert system is integrated into an existing expert system for in-circuit diagnosis, which is described in L. Apfelbaum, "An Expert System for In-Circuit Fault Diagnosis," *IEEE* 1985 *Proceedings of the International Test Conference*, pp. 868–874 and L. Apfelbaum, "Improving In-Circuit Diagnosis of Analog Networks with Expert Systems Techniques," *IEEE* 1986 *Proceedings of the International Test Conference*, pp. 947–953.

In-circuit test data data base 20 includes key pattern identification numbers for the nodes of devices of BUT 12 that are connected to busses on BUT 12; key patterns are the points in the sequence of inputs provided and outputs expected (stored at a pattern random access memory, not shown) through test pins of bed of nails 14 associated with a given device 13 on board 12 during a test of that device. Circuit description data base 22 includes a detailed description of circuit topology of BUT 12. Measurement rules 24 include expert system rules relating to taking voltage measurements of particular nodes on BUT 12 depending upon the technology of device 13 being tested (for example, CMOS, AS, etc.) and upon the exact point in time for making a measurement. Analysis rules 26 include expert system rules employed to analyze the voltage measurements obtained and to identify faulty devices causing bus failures. Device models data base 28 includes mathematical models for the various devices 13 on BUT 12; these models include the attributes of the output stages of the different technologies, and these are updated as experience during testing indicates the existing models can be improved based upon measured values with an artificial intelligence technique called simulated annealing, as described in S. Kirkpatrick, et al., "Optimization by Simulated Annealing," *Science*, Vol. 220, pp. 671–680 (1983). Device failures data base 30 includes information on the failures generated during in-circuit testing of BUT 12. Measurement request data base 31 is a temporary data base created for a device 13 for listing measurement requests. Measurements data base 32 includes the voltage measurements made of failed pins of devices 13 of BUT 12 during bus failure testing. Transformed data base 34 includes transformations of the measurements in data base 32 in order to permit comparison of measurements of different device 13 of BUT 12.

Figure 2:
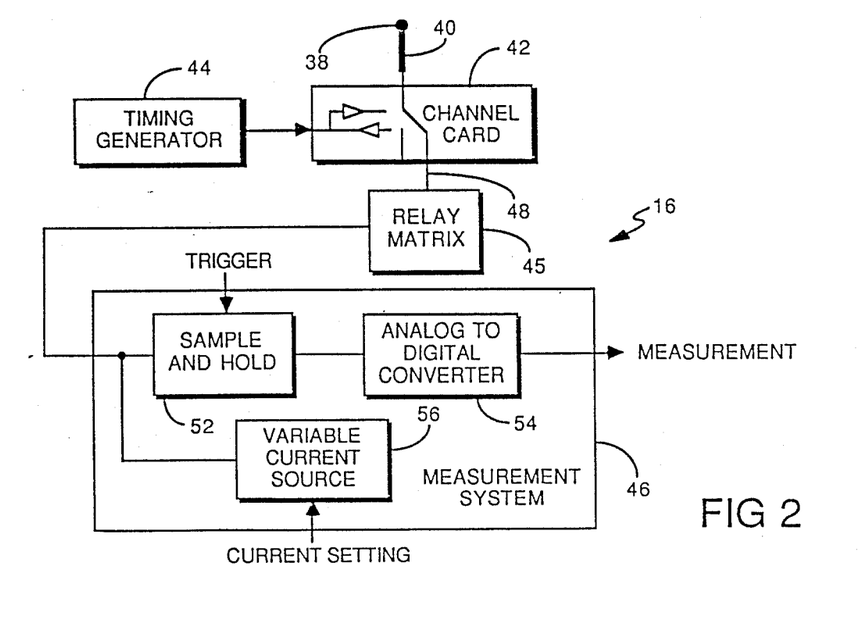
FIG. 2 is a block diagram of measurement apparatus of the FIG. 1 system.

The relevant hardware of measurement apparatus 16 is shown in FIG. 2. Node 38 of BUT 12 is shown connected via test pin 40 (in reality there are a large number of test pins, as shown in FIG. 1) through channel card 42 located in close proximity to bed of nails 14. Channel card 42 includes a plurality of detectors and drivers that are controlled by timing generator 44 to provide the desired inputs to BUT 12 and to detect resulting outputs. A test pin 40 can also be directly connected to analog instruments, e.g., measurement system 46. Test pin 40 is shown connected through a switch on channel card 42 and line 48 to relay matrix 45, which connects line 48 to line 50 to measurement system 46, employed to measure voltages used in diagnosing bus failures in system 10. Line 50 is connected to sample-and-hold circuit 52 and variable current source 56. The analog output of sample-and-hold circuit 52 is provided to analog-to-digital converter 54, which provides a digital output measurement used by the software of system 10. Analog-to-digital converter 54 thus acts as a voltmeter to measure voltage at node 38, and includes different measuring ranges. Variable source 56 is capable of providing small output currents to be injected into node 38, depending upon the current setting input to it from the software of system 10.

Operation

In operation, during in-circuit testing of isolated devices, bus failure diagnosis system 10 is triggered upon certain failure conditions to make incremental voltage measurements with respect to the particular device 13 being isolated, and after in-circuit testing of all devices, all triggered voltage measurements are transformed to permit comparison and then analyzed to identify a device for each node as the one causing the failure.

In-circuit testing proceeds in general as normal with each device on BUT 12 being tested in turn. The in-circuit testing of each device 13 employs those test pins 40 that contact the nodes 38 to which the leads of the device are connected. The testing also employs test pins 40 contacting nodes at inputs of the other devices that control the inputs of the particular device 13 being tested. Test vectors are applied to the digital device inputs while the outputs are detected and compared with expected responses. Analog components receive specific analog signal inputs, and the outputs are similarly analyzed by analog instruments. In addition, there can be monitoring to see if an applied input signal was received at the device input pin, something which could be prevented if there were a fault associated with an input pin.

Trigger Phase

Figure 4:
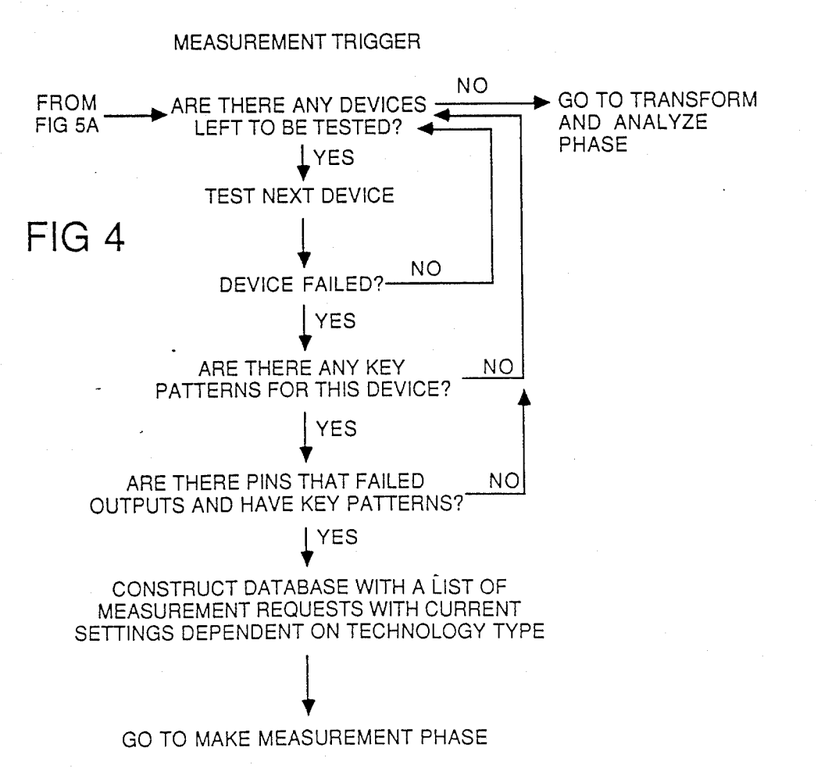
FIG. 4 is a flow chart of a measurement trigger procedure of the FIG. 1 system.

Referring now to FIG. 4, the procedure involved in triggering bus failure diagnosis system 10 to make a passive voltage measurement is shown. The trigger phase of bus failure diagnosis system 10 is activated upon the failure of any digital device 13 on a node 38. System 10 then determines, using a series of test rules, whether further bus measurements are warranted.

The first test rule, employed after in-circuit testing of a device 13 has finished, is whether there are any key patterns for the device. A key pattern is an exact test pattern in the sequence necessary to generate a specific output state. In some circumstances, the test pattern may consist of a plurality of different inputs which trigger different points at different times thus producing a desired output. If there are no key patterns for a device, measurements according to the invention cannot be made.

The next test rule is whether the particular pin that failed is an output that is connected to a node. This step determines whether the failing device could cause a bus failure. This step also determines whether the particular pin has a key pattern. If the pin does not have key patterns, system 10 cannot make the measurement.

Once system 10 determines that it can test this device 13, measurement request data base 31 is constructed with a list of measurement requests. The list is a library of the states to be tested for each pin to be tested. The possible states to be tested are: high, low, tristate, and failing state; the failing state is the first state at which the device failed; it is actually the same as one of the other three states. For each failed output to be tested, information about the node being tested, the pin being tested, the current increments to be used, and the key pattern identification number for the particular pin are stored in the library. The current increment to be used for a particular device 13 is dependent on the technology of the device, as indicated in the table below.

| Device Technology | Current Increment |
| --- | --- |
| AS, TTL, S, F | 16 mA |
| CMOS, HC, LS, ALS, MOS, L | 2 mA |
| Other technology | 7 mA |

Measurements request data base 31 is dynamic in that failure information is generated as each device 13 is tested.

Once measurement request data base 31 is constructed for the failing device, system 10 moves on to the measurement phase of the test to perform the measurement requests listed in the measurement request data base 31.

Measurement Phase

Figure 5A:
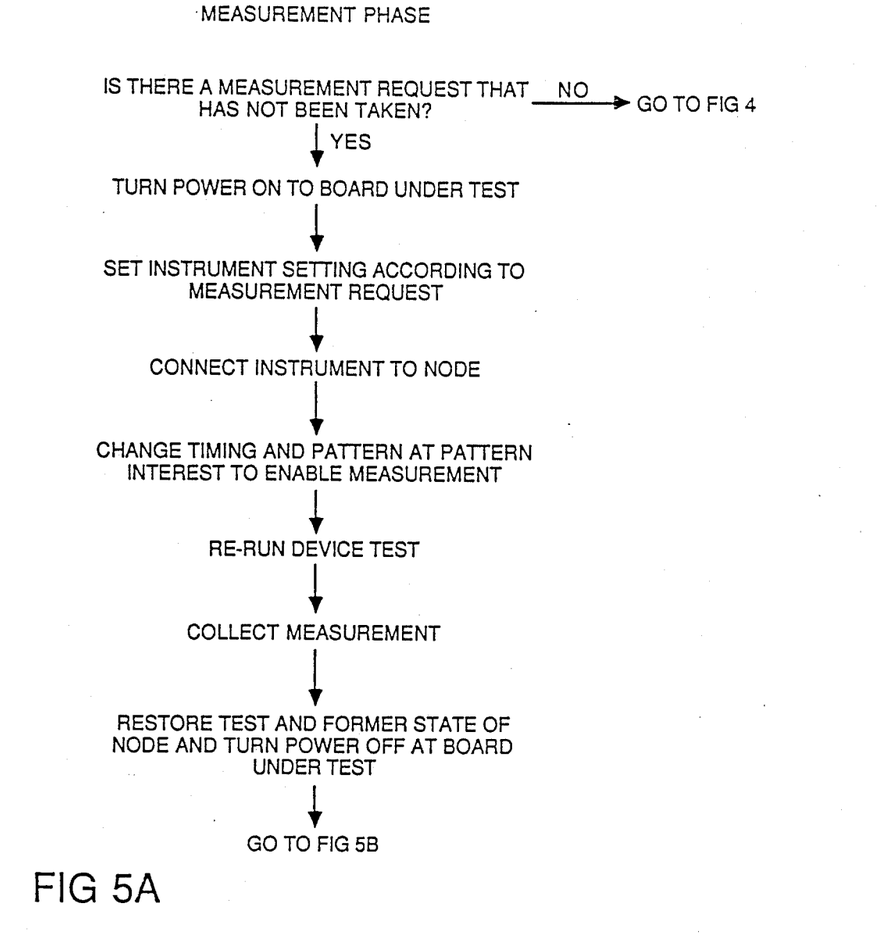
FIGS. 5A and 5B are a flow chart of a measurement procedure of the FIG. 1 system.
Figure 5B:
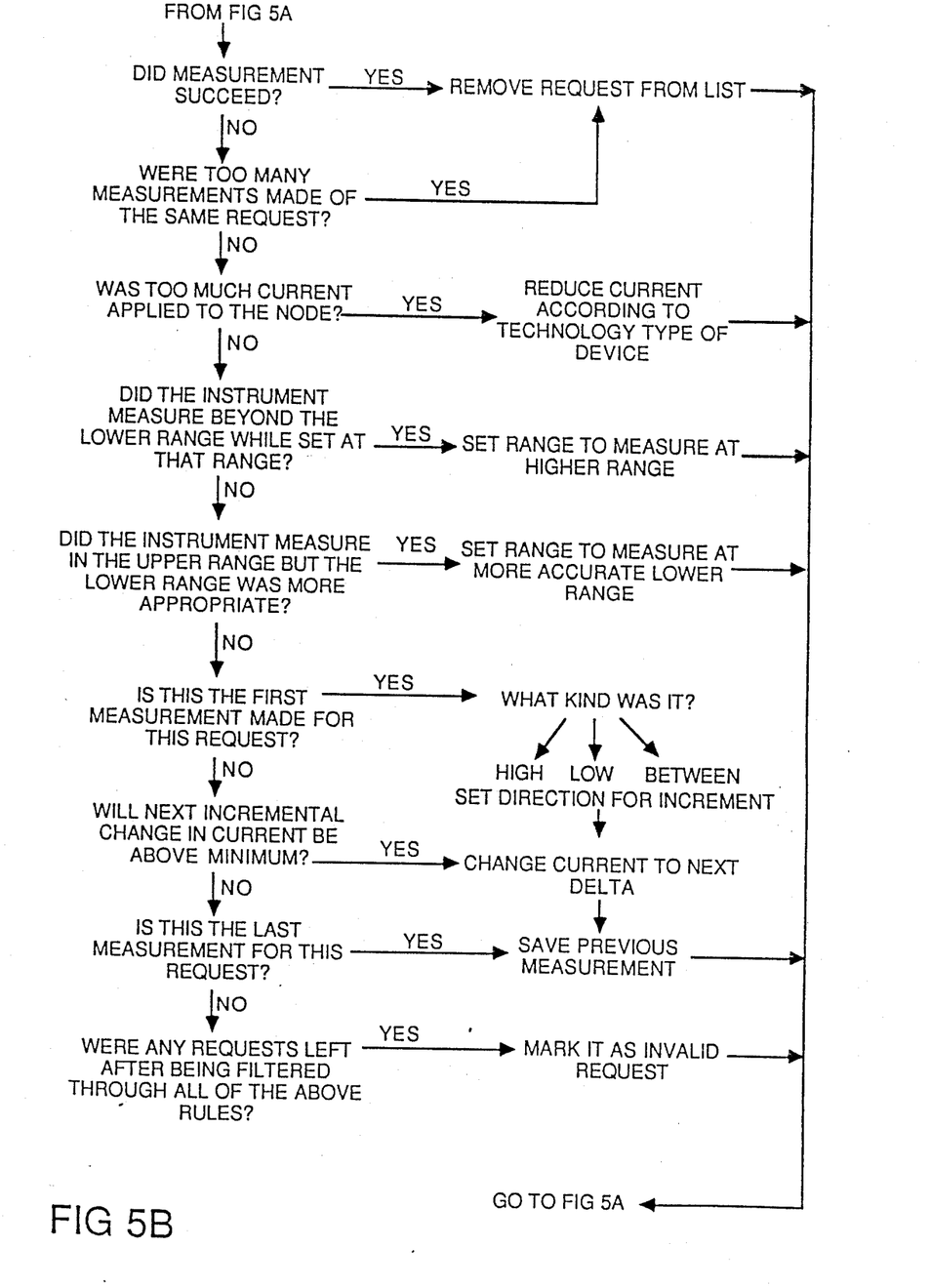

The measurement procedure for making passive voltage measurements employs the rules listed in FIGS. 5A, 5B. These rules are designed to obtain the most useful information about the node in as few measurements as possible. This procedure dynamically adjusts the measurement scale of measurement apparatus 16 and determines the exact point in time to make the measurement, freezing the states of all pins of the device during the measurement.

When beginning a pass through the measurement phase, system 10 first checks to see if there are any measurements left to be taken for the device. This is determined by referring to the test status indicator in the measurements request library which is in measurement request data base 31. If there are no measurements left to be taken, the system returns to perform in-circuit testing of the next device, as indicated in FIG. 4.

If there are measurements left to be taken, initialization steps are taken. These include: turning power on to BUT 12; setting instrument settings within measurement apparatus 16 to the scales and increments stored in the measurement request library; and connecting continuity measurement system 46 to node 38.

Figure 6A:
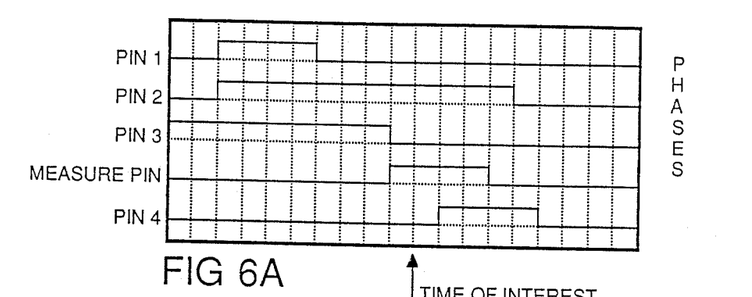
FIGS. 6A–6C are timing diagrams illustrating a method of holding the states of a device during voltage measurements made by the FIG. 1 system.
Figure 6B:
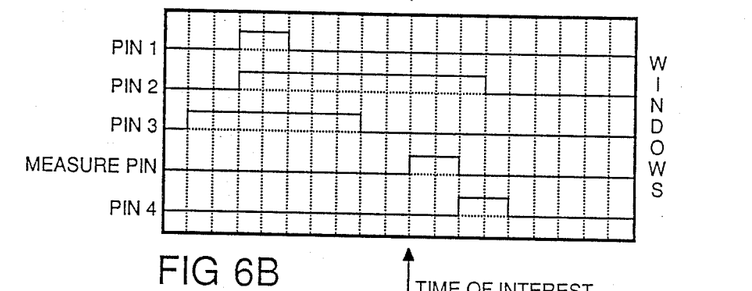
Figure 6C:
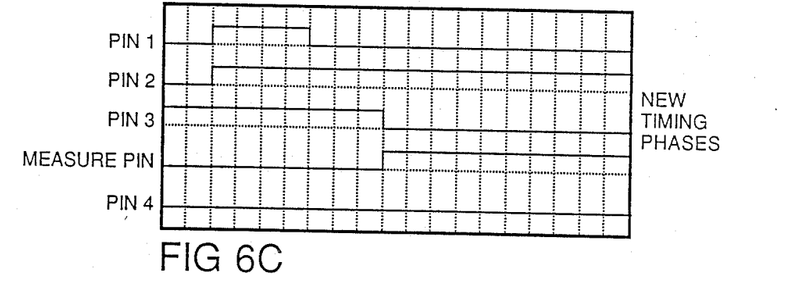

The test vectors to be provided to device 13 by timing generator 44 are then set, by reference to information in the measurements request list in measurements request data base 31, in a manner to stabilize the output at the precise time of interest, i.e., the time within a clock period when a failure occurred. Referring to FIGS. 6A-6C, there is shown the timing information of device pins for the clock period during which an output at the measure pin failed. This timing information is obtained from timing generator 44, identified by the key pattern identification number, and is used to determine when to stabilize the device and then take a voltage measurement. FIG. 6A thus shows the inputs and outputs of a device 13 for one clock period. FIG. 6B shows the windows where a valid measurement could be taken of a particular signal; i.e., the failure of measure pin presumably occurred when it was supposed to go high, and the window is within the time that the output should have been high. The beginning of this window is labelled "time of interest". The changed timing information to be employed by timing generator 44 is shown in FIG. 6C. As can be seen, all states are frozen after the time of interest, which can be specified with high resolution (e.g., 1 ns). The states can be frozen for much longer than a clock period (e.g., 20 μs). When the passive voltage measurement is actually made, timing generator 44 runs at normal speed through clock periods prior to the one in which the failure occurred, and freezes states at the appropriate time in this period, as shown in FIG. 6C. This permits analysis of dynamic failures. The output of interest thus remains the same, allowing the signal at measure pin (electrically common to line 50) to stabilize, and thus allowing a valid measurement to be taken by measurement system 46.

Figure 3:
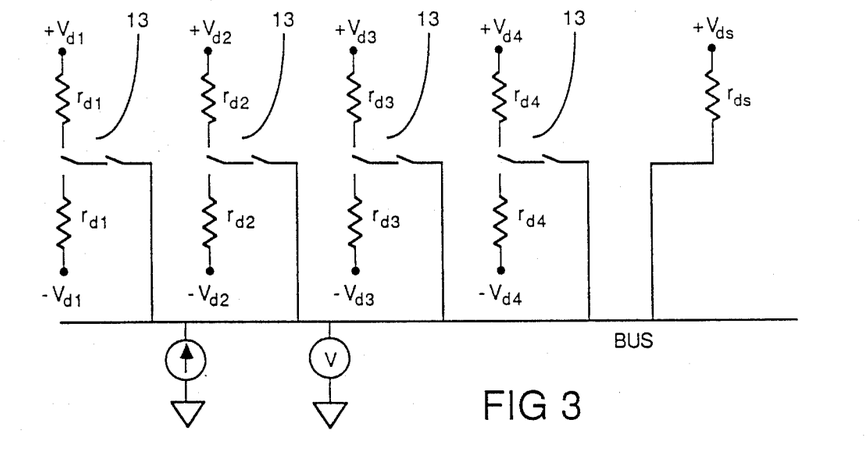
FIG. 3 is schematic of an equivalent circuit of tristable devices connected to a bus tested by the FIG. 1 system.

Referring to FIG. 3, the passive voltage measurement involves measuring voltage while a small probe current (e.g., less than 50 mA, typically about 5 mA, depending on technology) may be injected into (either sourced to or sinked from) node 38. Because this current is used only to move the voltage enough to obtain a measurable voltage difference, not to change the state of device 13, there is no danger of damaging any devices 13, regardless of technology type. The first voltage measurement is without any injected current. Subsequent measurements involve incrementally changing the magnitude of injected current, as described below.

After the measurement is taken, the timing information is restored to pre-measurement condition, and power to BUT 12 is turned off. This insures that if the next measurement is further into the stream of input signals (e.g., involving a failure in a later clock period), the signals still correctly simulate the input stream.

After the measurement is taken, tests of the procedure of FIG. 5B are run to make sure that the measurement is valid and to determine what measurement to make next.

The first tests attempt to throw out invalid measurements and steer the instrument to quickly get to a valid value. The first test determines whether the measurement succeeded, i.e., whether a valid measurement was received from measuring apparatus 16. This test catches situations were the measuring apparatus is shut off or is sending error messages. The next test is to determine whether too many measurements were made of the same request. If more than five measurements were taken, system 10 assumes it has enough information for that particular measurement request. In these situations if the answers to the questions are no and yes respectively, then the measurement request is removed from the list, and system 10 begins the measurement procedure again for the next request. The next test is to determine if too much current was applied to the node thereby saturating it. If there was too much current, then the size of the current increment and the amount of current applied to the node are reduced according to the type of device and the system performs the measurement procedure again. E.g., the increments listed above are reduced by one-half. The next test is whether the measured value was too high for the lower range of the instrument (analog to digital converter 54). If it was, the range is raised, and the measurement procedure is rerun.

The next test is whether the instrument measured in an upper range when a lower range was more appropriate, for example, because the lower range would give more accurate values. If yes, then the instrument is changed to the more accurate range, and the system begins the measurement procedure again.

The rest of the tests are aimed at getting one valid measurement after another. For example, the next test is whether this is the first measurement for this measurement request. If it is, then the direction of the current increment is set so as to get the largest number of meaningful measurements. For example, if the measurements were at the low end of an expected result, the increments are set to increase the value of the injected current. If the measurement were at the high end of the expected result, the increments are set to reduce the value of the injected current. Once the direction is set, the current is incremented; the previous measurement is saved, and the next measurement is taken.

If the measurement just made was not the first, the current level is checked to see whether the next incremental change will be above the minimum current level of 0.25 mA. If yes, then the current is incremented; the previous measurement is saved, and the next measurement is taken. If no, and if this is the last measurement of the request, the measurement is saved, and the next measurement is taken. If no, and if this is not the last measurement of the request, the request is marked as invalid, and the system goes on to the next request.

As noted above, the measurement requests could include requests for measurement at the same output pin at different states. After the measurements for a particular device 13 have been performed, system 10 returns to its regular in-circuit testing of a new device 13.

Transformation Phase

After all devices have been tested in the in-circuit testing, including the passive voltage measurement described above, the raw measurement data in measurements data base 32 are transformed, in order to make useful comparisons between measurements at different devices. Four transform methods are employed. In order of importance, in terms of likelihood of generating information useful in identifying faulty devices, they are: (1) calculation of Thevenin equivalent impedance and voltage, (2) calculation of estimated impedance of hypothetical stuck device, (3) calculation of difference between high and low outputs of a device, and (4) comparison of off output with opposite-of-stuck-state output. For each set of voltage measurements at a pin at a particular output state (high, low, tristate) one or more of these four transforms are employed to transform the measurements. Each transform will be discussed in turn.

In the first transformation, the Thevenin equivalent impedance, $Z_{TH}$, and voltage, $V_{TH}$, are calculated by performing a least squares regression on the injected currents, $i_x$, and resulting measured voltages, $v_x$, for all n pairs of such information for a given output pin when driven at the same state, according to the following equations:

$$V_{TH} = \frac{\sum_{x=1}^{n} i_x^2 \sum_{x=1}^{n} v_x - \sum_{x=1}^{n} i_x v_x \sum_{x=1}^{n} i_x}{n \sum_{x=1}^{n} i_x^2 - \sum_{x=1}^{n} i_x \sum_{x=1}^{n} i_x} \quad (1)$$

$$Z_{TH} = \frac{n \sum_{x=1}^{n} i_x v_x - \sum_{x=1}^{n} i_x \sum_{x=1}^{n} v_x}{n \sum_{x=1}^{n} i_x^2 - \sum_{x=1}^{n} i_x \sum_{x=1}^{n} i_x} \quad (2)$$

$Z_{TH}$ is the slope of a $v_x$ versus $i_x$ plot; $V_{TH}$ is the intercept of the function with the origin ($i_x = 0$). These transformations are calculated separately for each of the output states at which there were measurements.

The transformation involving calculation for estimated impedance of a hypothetical stuck device is made using equation (1), replacing $i_x$ with $i_x$ minus the current of the output at the pin at the particular state, which information is obtained from device models data base 28. (This assumes that the device is functioning properly and driving the node along with the stuck device.) This transformation is done separately for the different output states at which there were voltage measurements.

The transformation involving the difference between high and low states simply involves taking the difference in the measured voltage (with no injected current) when the device is instructed to drive a high output and a low output. This thus results in only one transformed value per pin.

Figure 7A:
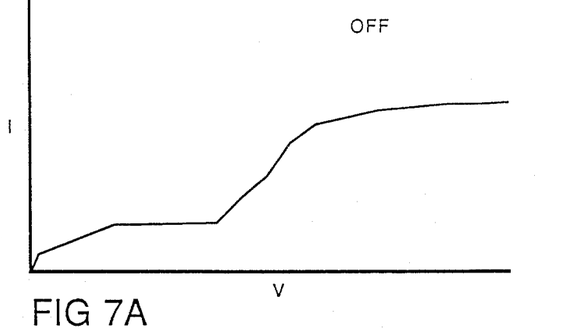
FIGS. 7A–7C are graphs of current versus voltage illustrating a method of transforming measured voltages in the FIG. 1 system.
Figure 7B:
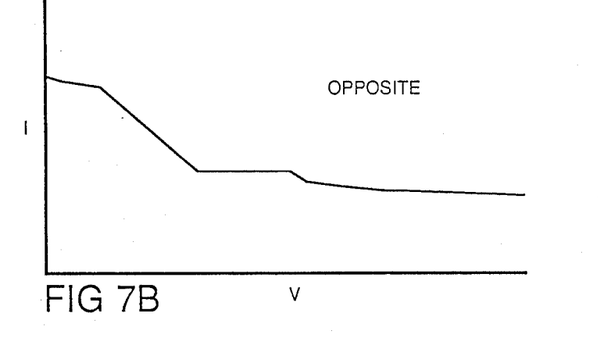
Figure 7C:
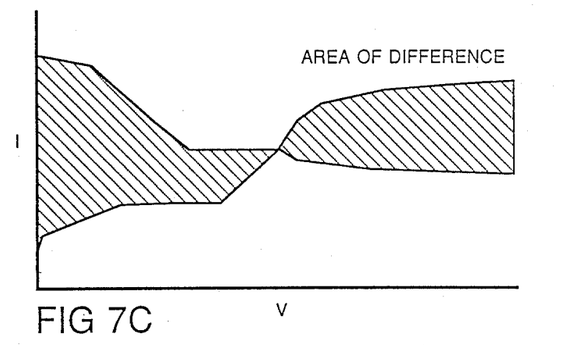

The transformation involving comparison of the off output with the opposite-of-stuck-state output is illustrated in FIGS. 7A–7C. FIG. 7A illustrates a plot of pairs of injected current and resulting measured voltage when the device has been turned off; it thus includes information of the stuck device. FIG. 7B illustrates the same information when the device has been instructed to drive an output that is the opposite of the stuck state (i.e., high if the stuck state is low, and low if the stuck state is high). The area between the two, shown in FIG. 7C, is then calculated and used as the transformed datum for this pin of the device. There thus is only one transformed value per pin.

All of the transformed information is placed in transformed data base 30, and tagged to indicate device pin and state, if applicable.

Analysis Phase

After the measured data has been transformed, the analysis stage utilizes the transformed data to diagnose which device on a bus is the worst failing device, i.e., the device most likely to be causing the bus failure.

The rules for this final analysis and diagnosis are ordered by roughness to screen the failure candidates, i.e., those devices connected to a particular node. The roughest, most general diagnosis is done first, giving a rough idea of the potential candidates. Finer and finer rules are used to decide between discrepancies, to group related failures together, and, finally, to pick out the one most likely faulty device of all the failure candidates.

The general diagnosis directly utilizes and compares the transformed data. In order of priority, this phase utilizes the following rules:

Rule 1: The Thevenin equivalent impedance of each device is compared, and the device with the highest impedance is diagnosed as the failing device.

Rule 2: The estimated impedances of hypothetical stuck device is compared, and the device with the lowest associated stuck impedance is diagnosed as the failing device.

Rule 3: The differences between high and low outputs of the devices are compared, and the device with the smallest difference is diagnosed as the failing device.

Rule 4: The results of the comparison of off outputs with opposite-of-stuck-state outputs are compared, and the device with the smallest power difference is diagnosed the failing device.

These rules are weighted such that the combination of the diagnosis (2), (3), and (4) can overrule the diagnosis of (1), and the combination of the diagnosis (3) and (4) can overrule the diagnosis of (2). In some instances one of these comparisons will not yield a designated faulty device, for failure to meet comparison validity conditions described below.

The device with the highest Thevenin equivalent impedance is chosen in Rule 1 because the stuck device will always have a higher impedance than the stuck device in parallel with another device. The result of this rule is disregarded as not valid when the difference between the highest impedance and the second highest impedance is less than 40 percent larger than the difference between the second highest impedance and the third highest impedance. In this case the impedances are too close together to indicate two devices in parallel at the higher impedance. This rule also contains a provision for if there are only two devices on the node. In this situation, the higher impedance device will be diagnosed as a likely faulty device as long as it has an impedance greater than 20 ohms and it also is 10 or more ohms above the lower impedance device.

The reasoning behind the stuck device impedance comparison (Rule 2) is almost the opposite. When calculating the hypothetical stuck device impedance, the theoretical impedance of the known device is subtracted from the total impedance. The lower this difference, the more likely it is that there is not another device contributing to the total impedance. If there is no other device contributing to the impedance, then it is likely that the device that produced this low hypothetical impedance is the stuck device. This rule also contains a provision for if there are only two devices on the node. In this situation, system 10 looks at the highest and lowest hypothetical impedances. If the highest is greater than 400 ohms, it is diagnosed as a likely faulty device, if not, and if the lowest is less than 5 ohms, then the lowest is diagnosed as a likely faulty device.

The reasoning behind the comparison of the differences between the higher and lower outputs (Rule 3) is that the stuck device would not be able to switch between high and low.

The reasoning behind the comparison of off outputs with opposite-of-stuck-state outputs (Rule 4) is that the stuck device would not be able to go to the opposite-of-stuck-state condition. Therefore, there would theoretically be no difference between the two curves.

The comparisons of the first two general rules are made for measurements when the devices were in the same states.

In addition to the general diagnosis rules, there are a plurality of finer diagnosis rules used to strengthen the diagnosis of the single identified faulty device from the rough comparison or to pick between a plurality of nodes that were identified as faulty in the rough analysis (e.g., one being picked for comparison of measurement at high states and one being picked for measurements at low states). These rules, in order of priority, include:

Rule 5: Choose the most likely failing device solely by the results of the measurements done on the relevant states. With Thevenin's equivalent, the failing state is the relevant state; with hypothetical equivalent of the stuck device, the state opposite the failing state is most relevant. The theory behind this rule is that the most relevant state will provide more reliable data.

Rule 6: If all the devices on the node failed but one, diagnose the "non-failing" device as the most likely faulty device. This is because the "non-failing" device probably has a faulty internal enable so that this particular device will not fail, but it will make all the other devices on the bus look as if they are failing.

Rule 7: If most of the devices on a node failed and of the devices that passed only one has key patterns, then diagnose this device as the most likely faulty device. The reasoning behind this rule is the same as for Rule 2.

Rule 8: Blame analog parts which are connected to the node and are failing in a manner to cause bus failure. The reasoning behind this rule is that incorrect analog devices could cause a bus to fail while not affecting the test results of individual devices.

Rule 9: Look for devices which had failing enable line test during the in-circuit test. The reasoning behind this rule is that a device with a bad enable line can likely cause a whole device to be bad.

Rule 10: Analyze the projected differences in current based on the data derived from transform (4). The reasoning behind this rule is that change in current for the stuck device will be smaller than the good devices. This rule differs from the general rule utilizing transform (4) in that it projects the current over a wider range and then it utilizes this wider range to perform its analysis.

Rule 11: If no device with outputs on the bus was diagnosed as failing and there is only one device with an input on the bus, diagnose the device having the input as the most likely failing device. The reasoning of this rule is the process of elimination.

Rule 12: If a number of devices have inputs on the node but only one of these devices has failing outputs that are not related to the failing node, diagnose this device the most likely failing device. The reasoning of this rule is that if unrelated outputs are bad, this device is probably a bad device.

Rule 13: Look at the device which has the majority of failures and diagnose it the most likely failing device. If all else fails, this rule reduces the diagnosis to one worst failing device.

Other Embodiments

Other embodiments of the invention are within the scope of the following claims. E.g., the method applies to other dynamic circuit testing approaches, e.g., functional testing. Also, if during the analysis phase it is determined that there is not sufficient knowledge to pick a clear faulty device, and there are a plurality of devices on the node that were not measured (because they did not fail), measurements could then be made at these devices, and these measurements would then be transformed and analyzed with the earlier information. Key patterns could be precalculated, as above, or derived in real time during testing from either hardware data or other stored pattern information.

What is claimed is:

1. A method of determining which of a plurality of electrical devices connected to a single node of a circuit under test is causing a failure at that node comprising
   causing individual devices to drive said node to a state one device at a time,
   taking passive voltage measurements between said node and a reference voltage at separate times when individual devices are caused to drive said node, said voltage measurements including injecting a small current into said node and measuring a resulting change in voltage, said small current not being enough to change said state of said device, and
   analyzing measured voltages resulting when different devices are driving said node to identify which device is causing said failure.

2. A method of determining which of a plurality of electrical devices connected to a single node is causing a failure at that node comprising
   taking passive voltage measurements between said node and a reference voltage when a device driving the node is in different states, said voltage measurements including injecting a small current into said node and measuring a resulting change in voltage, said small current not being enough to change said state of said device, and
   analyzing measured voltages to determine if the device is faulty.

3. The method of claim 1 further comprising measuring voltage of said node when it is not driven by any device, and wherein said analyzing includes comparing said last mentioned voltage with said device voltage measurements obtained when different devices are driving said node.

4. The method of claim 1 wherein, prior to said injecting, input patterns are provided to said device at a rate simulating normal operating conditions, and inputs affecting said device are held at a predetermined state pattern during said injecting and measuring.

5. The method of claim 1 wherein said method is part of a method of circuit testing and further comprising performing circuit testing of said board under test,
   said circuit testing including identifying failed outputs of said devices,
   triggering said taking passive measurements at a said node based upon a failed output of a device at said node.

6. The method of claim 5 wherein said triggering includes listing failed outputs during circuit testing of a device and taking said passive voltage measurements after circuit testing of said device.

7. The method of claim 6 wherein said listing includes listing a measurement request for said node relating to current to be injected when measuring voltage.

8. The method of claim 7 further comprising preparing a library including key pattern information for said devices connected to nodes, and wherein said listing includes listing only those pins for which said library includes key pattern information.

9. The method of claim 1 wherein said taking passive voltage measurements includes taking a plurality of voltage measurements at a node at different injected currents for a given pin of a device connected to said node.

10. The method of claim 9 wherein a said plurality of voltage measurements are taken for a said pin when driven at each of a plurality of output states.

11. The method of claim 9 wherein one said voltage measurement is taken when no current is injected, and subsequent voltage measurements are taken at incremented current levels chosen to provide a range of measurement voltages.

12. The method of claim 9 wherein current is adjusted between measurements so as to reduce current if the prior measurements involved a current that resulted in saturating a device.

13. The method of claim 9 wherein the range of the voltage measurement instrument is adjusted if a prior measurement produced a measured voltage outside of its range.

14. The method of claim 9 wherein said injected currents are incremented in value between successive measurements.

15. The method of claim 14 wherein the magnitude of incrementing is dependent upon the technology type of said device.

16. The method of claim 14 wherein said injected currents are not incrementally changed if the resulting current is below a minimum value or above a maximum value.

17. The method of claim 14 wherein measurements are made on a new node after a predetermined number of successful measurements have been made at a node.

18. The method of claim 1 further comprising, prior to said analyzing, transforming measured voltage for a given device to a standard scale such that different devices can be compared.

19. The method of claim 18 wherein said transforming comprises computing a Thevenin equivalent impedance for plural voltage measurements for a given device.

20. The method claim 18 further comprising performing a regression analysis of plural voltage measurements at different injected currents to obtain an average impedance value.

21. The method of claim 18 wherein said transforming comprises computing a Thevenin equivalent for a hypothetical stuck device at said node, using impedance for plural voltage measurements and associated estimated stuck device currents based on the current of the instrument minus the estimated current of device driving said node.

22. The method of claim 19 further comprising computing a Thevenin equivalent voltage.

23. The method of claim 18 further comprising measuring voltage when a given device is driving in a high state and when a given device is driving in a low state, and taking the difference of the two.

24. A method of determining which of a plurality of electrical devices connected to a node of a circuit under test is causing a failure at that node comprising
causing individual devices to drive said node one device at a time,
taking passive voltage measurements at said node at separate times when individual devices are controlled to drive said node,
transforming measured voltage for a given device to a standard scale such that different devices can be compared, and
analyzing measured voltages resulting when different devices are driving said node to identify which is causing said failure,
said taking passive voltage measurements including measuring at high output states, low output states and off states, and
said transforming including determining the stuck state, and integrating the difference between the off state and the opposite state of the stuck state.

25. The method of claim 18, 19, 20, or 21 wherein said transforming is done for measurements at a particular state at a particular output pin of a device.

26. The method of claim 1 further comprising transforming measured voltage for a given device to an impedance prior to said analyzing.

27. The method of claim 26 wherein said analyzing includes comparing said impedances of different devices driving the same node.

28. The method of claim 27 wherein said impedances are analyzed and the highest impedance is identified as the one causing the failure.

29. The method of claim 28 wherein the device having the highest impedance is only identified as causing the failure if the difference between the highest impedance and the second highest impedance is larger than the difference between the second highest impedance and the third highest impedance.

30. The method of claim 28 wherein, if only two devices have impedances being compared, the highest impedance is identified as faulty if it is above a set value.

31. The method of claim 21 wherein the highest impedance is identified as faulty if it is greater than a set bound and if it is not, the lowest impedance is identified as faulty if it is below a minimum bound.

32. The method of claim 31 wherein the highest bound is 400 ohms and the lowest bound is 5 ohms.

33. The method of claim 23 wherein the device having the lowest difference is identified as the faulty device.

34. The method of claim 24 wherein the device having the smallest integrated value is identified as the faulty device.

35. The method of claim 28, 29, 30, 31, or 32 wherein said analyzing is done for measurements for different devices when said devices were operated to drive their outputs to the same state.

36. The method of claim 27 or 28 wherein said analyzing is done based on measurements made when the devices were operated to drive the same state at which they failed.

37. The method of claim 31 wherein said measured voltages are those taken when the device is operated at the state that is opposite of the state at which it failed.

38. The method of claim 1 wherein said analyzing includes determining if one device having an output connected to a node did not fail while all other devices having outputs connected to the node did fail, and, if so, identifying that one device as the faulty device.

39. The method of claim 1 wherein said taking passive voltage measurements is done at separate states, and said analyzing measured voltages includes identifying which device would appear to be faulty for measurements at the separate states, and further comprising, if more than one device has been identified as faulty, further analysis to reduce the number of devices identified as faulty.

40. The method of claim 39 wherein said further analysis includes determining whether there are faulty analog components connected to said node and, if so, identifying them as faulty.

41. The method of claim 39 wherein said further analysis includes determining whether there is a device that had failed to disable and, if so, identifying it as the faulty device.

42. The method of claim 39 wherein said further analysis includes calculating the current provided by each said device based upon said measured voltages and identifying the device that is faulty as the one having the smallest difference in current for different states of the same pin.

43. The method of claim 39 wherein said further analysis involves determining if an input was stuck, and, if so, identifying the device having that input as the faulty device.

44. The method of claim 39 wherein said further analysis involves determining whether plural devices had inputs on the node but only one device had a failure on its outputs that are not related to the failure node, and, if so, identifying that device as the faulty device.

45. Apparatus for determining which of a plurality of electrical devices connected to a single node of a circuit under test is causing a failure at that node comprising
means for causing individual devices to drive said node to a state one device at a time,
means for taking passive voltage measurements between said node and a reference voltage at separate times when individual devices are caused to drive said node, said means for taking voltage measurements including means for injecting a small current into said node and means for measuring a resulting change in voltage, said small current not being enough to change said state of said device, and
means for analyzing measured voltages resulting when different devices are driving said node to identify which device is causing said failure.

46. Apparatus for determining which of a plurality of electrical devices connected to a single node is causing a failure at that node comprising
means for taking passive voltage measurements between said node and a reference voltage when a device driving the node is in different states, said means for taking voltage measurements including means for injecting a small current into said node and means for measuring a resulting change in voltage, said small current not being enough to change said state of said device, and means for analyzing measured voltages to determine if the device is faulty.

47. The apparatus of claim 45 further comprising means for measuring voltage of said node when said node is not driven by any device, and said means for analyzing includes means for comparing said last mentioned voltage with said device voltage measurements obtained when different devices are driving said node.

48. The apparatus of claim 45 further comprising means for providing to said device input patterns at a rate simulating normal operating conditions and means for holding inputs affecting said device at a predetermined state pattern during injecting and measuring.

49. The apparatus of claim 45 wherein said apparatus is part of an apparatus for circuit testing and further comprising means for performing circuit testing of said board under test, said means for performing circuit testing including means for identifying failed outputs of said devices, and means for triggering said means for taking passive measurements at a said node based upon a failed output of a device at said node.

50. The apparatus of claim 49 wherein said means for triggering includes means for listing failed outputs during circuit testing of a device, and said means for taking said passive voltage measurements takes said passive voltage measurements after circuit testing of said device.

51. The apparatus of claim 50 wherein said means for listing includes means for listing a measurement request for said node relating to current to be injected when measuring voltage.

52. The apparatus of claim 51 further comprising means for preparing a library including key pattern information for said devices connected to nodes and wherein said means for listing includes means for listing only those pins for which said library includes key pattern information.

53. The apparatus of claim 45 wherein said means for taking passive voltage measurements includes means for taking a plurality of voltage measurements at a node at different injected currents for a given pin of a device connected to said node.

54. The apparatus of claim 53 wherein said means for taking passive voltage measurements takes one said voltage measurement when no current is injected and takes subsequent voltage measurements at incremented current levels chosen to provide a range of measurement voltages.

55. The apparatus of claim 53 wherein the range of the means for voltage measurement is adjusted if a prior measurement produced a measured voltage outside of the range of said means for voltage measurement.

56. The apparatus of claim 53 wherein said injected currents are incremented in value between successive measurements.

57. The apparatus of claim 56 wherein the magnitude of incrementing is dependent upon the technology type of said device.

58. The apparatus of claim 45 further comprising means for transforming measured voltage for a given device to a standard scale such that different devices can be compared.

59. The apparatus of claim 58 wherein said means for transforming comprises means for computing a Thevenin equivalent impedance for plural voltage measurements for a given device.

60. The apparatus of claim 58 further comprising means for performing a regression analysis of plural voltage measurements at different injected currents to obtain an average impedance value.

61. The apparatus of claim 58 wherein said means for transforming comprises means for computing a Thevenin equivalent for a hypothetical stuck device at said node, using impedance for plural voltage measurements and associated estimated stuck device currents based on the current of the instrument minus the estimated current of a device driving said node.

62. The apparatus of claim 59 further comprising means for computing a Thevenin equivalent voltage.

63. The apparatus of claim 58 further comprising means for measuring voltage when a given device is driving in a high state and when a given device is driving in a low state, and taking the difference of the two.

64. Apparatus for determining which of a plurality of electrical devices connected to a node of a circuit under test is causing a failure at that node comprising means for causing individual devices to drive said node one device at a time, means for taking passive voltage measurements at said node at separate times when individual devices are controlled to drive said node, means for transforming measured voltage for a given device to a standard scale such that different devices can be compared, and means for analyzing measured voltages resulting when different devices are driving said node to identify which is causing said failure, said means for taking passive voltage measurements including means for measuring at high output states, low output states and off states, and said means for transforming including means for determining the stuck state and means for integrating the difference between the off state and the opposite state of the stuck state.

65. The apparatus of claim 45 further comprising means for transforming measured voltage for a given device to an impedance prior to said analyzing.

66. The apparatus of claim 65 wherein said means for analyzing includes means for comparing said impedances of different devices driving the same node.

67. The apparatus of claim 66 wherein said means for analyzing analyzes impedances and identifies the device with the highest impedance as the one causing the failure.

68. The apparatus of claim 67 wherein the means for analyzing only identifies the device having the highest impedance as the one causing the failure if the difference between the highest impedance and the second highest impedance is larger than the difference between the second highest impedance and the third highest impedance.

69. The apparatus of claim 66 or 67 wherein said means for analyzing analyzes based on measurements made when the devices were operated to drive the same state at which they failed.

70. The apparatus of claim 45 wherein said means for analyzing includes means for determining if one device having an output connected to a node did not fail while all other devices having outputs connected to the node did fail, and, if so, said means for analyzing identifies that one device as the faulty device.

71. The apparatus of claim 45 wherein said means for taking passive voltage measurements takes voltage measurements at separate states, and said means for analyzing measured voltages includes means for identifying which device would appear to be faulty for measurements at the separate states, and further comprising means for further analysis, if more than one device has been identified as faulty, to reduce the number of devices identified as faulty.

72. The apparatus of claim 71 wherein said means for further analysis includes means for determining whether there are faulty analog components connected to said node and, if so, identifying them as faulty.

73. The apparatus of claim 71 wherein said means for further analysis includes means for determining whether there is a device that had failed to disable and, if so, said means for further analysis identifies said failed to disable device as the faulty device.

74. The apparatus of claim 71 wherein said means for further analysis includes means for calculating the current provided by each said device based upon said measured voltages and means for identifying the device that is faulty as the one having the smallest difference in current for different states of the same pin.

75. The apparatus of claim 71 wherein said means for further analysis involves means for determining if an input was stuck, and, if so, said means for further analysis identifies the device having that input as the faulty device.

76. The apparatus of claim 71 wherein said means for further analysis includes means for determining whether plural devices had inputs on the node but only one device had a failure on its outputs that are not related to the failure node, and, if so, said means for further analysis identifies that device as the faulty device.

* * * * *